United States Patent
Saito et al.

(10) Patent No.: US 9,153,708 B2
(45) Date of Patent: Oct. 6, 2015

(54) LIGHT RECEIVING CIRCUIT AND PHOTOCOUPLER

(71) Applicant: KABUSHIKI KAISHA TOSHIBA, Minato-ku (JP)

(72) Inventors: Hisami Saito, Fukuoka-ken (JP); Masayuki Sugizaki, Kanagawa-ken (JP); Shigeyuki Sakura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 211 days.

(21) Appl. No.: 14/023,387

(22) Filed: Sep. 10, 2013

(65) Prior Publication Data
US 2014/0284458 A1 Sep. 25, 2014

(30) Foreign Application Priority Data

Mar. 22, 2013 (JP) .................. 2013-061153
Aug. 2, 2013 (JP) .................. 2013-161876

(51) Int. Cl.
*H01L 31/02* (2006.01)
*H03F 3/08* (2006.01)
*H03F 3/21* (2006.01)
*H03F 3/45* (2006.01)

(52) U.S. Cl.
CPC .......... *H01L 31/02019* (2013.01); *H03F 3/085* (2013.01); *H03F 3/211* (2013.01); *H03F 3/45282* (2013.01); *H03F 2203/45358* (2013.01); *H03F 2203/45674* (2013.01)

(58) Field of Classification Search
CPC ........... H01L 31/02016; H03F 3/45282; H03F 2203/45358; H03F 2203/45674; H03F 3/085; H03F 3/211

USPC .......................... 250/214 A, 214 R
See application file for complete search history.

(56) References Cited

U.S. PATENT DOCUMENTS

| | | | |
|---|---|---|---|
| 8,207,488 B2* | 6/2012 | Suzuki et al. ............. | 250/214 A |
| 8,222,877 B2* | 7/2012 | Cerchi et al. .................. | 323/282 |
| 2005/0052231 A1* | 3/2005 | Schmidt et al. ................. | 330/98 |
| 2013/0234007 A1 | 9/2013 | Sugizaki et al. | |
| 2014/0291488 A1* | 10/2014 | Laforce ................... | 250/214 LA |

FOREIGN PATENT DOCUMENTS

| | | | |
|---|---|---|---|
| JP | 2005-210558 A | 8/2005 | |
| JP | 2007-005901 A | 1/2007 | |
| JP | 2009-225096 A | 10/2009 | |
| JP | 2011-228914 A | 11/2011 | |

* cited by examiner

*Primary Examiner* — Seung C Sohn
(74) *Attorney, Agent, or Firm* — White & Case LLP

(57) ABSTRACT

A light receiving circuit includes a light receiving element, a transimpedance amplifier, a delay circuit and a comparator. The transimpedance amplifier is configured to convert the current signal into a first voltage. The comparator includes first to third current control elements each including first to third electrodes and configured to control current of the third electrode by voltage of the second electrode. The first voltage is inputted to the second electrode of the first current control element. Output voltage of the delay circuit is inputted to the second electrode of the second current control element. A second voltage is inputted to the second electrode of the third current control element. The comparator is configured to compare output current of the first current control element with sum of output current of the second current control element and output current of the third current control element.

16 Claims, 14 Drawing Sheets

LIGHT RECEIVING CIRCUIT AND PHOTOCOUPLER

CROSS-REFERENCE TO RELATED APPLICATIONS

This application is based upon and claims the benefit of priority from Japanese Patent Application No. 2013-061153, filed on Mar. 22, 2013 and Japanese Patent Application No. 2013-161876, filed on Aug. 2, 2013; the entire contents of which are incorporated herein by reference.

BACKGROUND

The light receiving circuit for converting an optical signal into an electrical signal is widely used in various fields. For instance, the photocoupler equipped with the light receiving circuit is widely used in electronic devices for industrial, communication, and household use.

In these electronic devices, signals are mutually transferred between different power supply systems such as DC voltage, AC voltage, and telephone line power supply systems.

Use of a photocoupler enables transfer of electrical signals between different power supply systems insulated from each other.

In the light receiving circuit installed in e.g. a photocoupler, the current of the light receiving circuit increases with the increase of the input level of the pulse optical signal. Thus, the delay time of the signal increases. This may increase the output pulse width distortion.

DETAILED DESCRIPTION

In general, according to one embodiment, a light receiving circuit includes a light receiving element, a transimpedance amplifier, a delay circuit and a comparator. The light receiving element is configured to convert a received optical signal into a current signal and to output the current signal. The transimpedance amplifier is configured to convert the current signal into a first voltage. A delay circuit is configured to delay the first voltage. A comparator includes first, second, and third current control elements each including first, second, and third electrodes and configured to control current of the third electrode by voltage of the second electrode with reference to the first electrode. The first electrodes of the first to third current control elements are commonly connected to current supply means. The first voltage is inputted to the second electrode of the first current control element. Output voltage of the delay circuit is inputted to the second electrode of the second current control element. A second voltage is inputted to the second electrode of the third current control element. The comparator is configured to compare output current of the first current control element with sum of output current of the second current control element and output current of the third current control element.

Embodiments of the invention will now be described with reference to the drawings.

Figure 1:
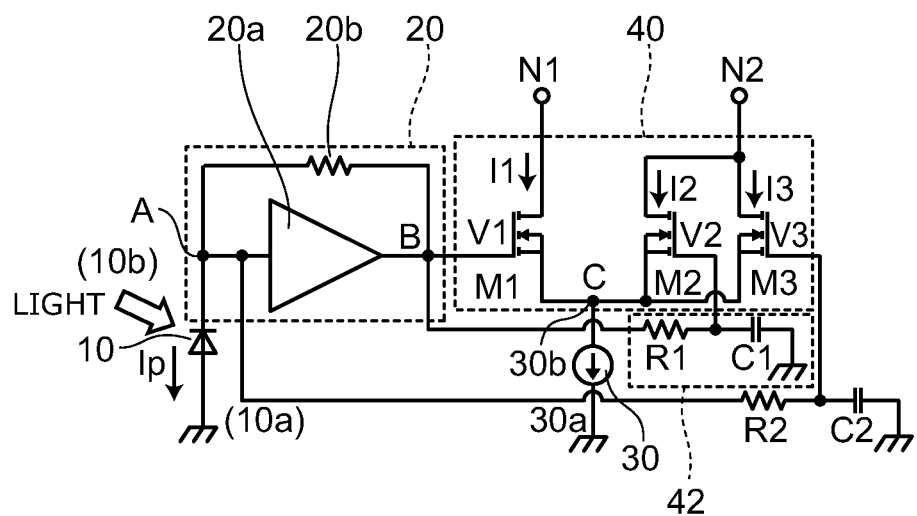
FIG. 1 is a circuit diagram of a light receiving circuit according to a first embodiment of the invention.

FIG. 1 is a circuit diagram of a light receiving circuit according to a first embodiment of the invention.

The light receiving circuit includes a light receiving element 10, a transimpedance amplifier 20, a current source 30, a comparator 40, and a delay circuit 42.

The light receiving element 10 has a first terminal 10a connected to a first potential (e.g., ground), and a second terminal 10b on the opposite side from the first terminal 10a. The light receiving element 10 converts the received optical signal into current Ip, and outputs the current Ip. The light receiving element 10 can be e.g. a photodiode made of Si, InGaAs or the like.

The transimpedance amplifier 20 has an input terminal A (coinciding with 10b) and an output terminal B. The transimpedance amplifier 20 includes an inverting amplifier 20a and a feedback resistor 20b. The transimpedance amplifier 20 converts the current Ip inputted at the input terminal A from the light receiving element 10 into a voltage signal, and outputs the voltage signal at the output terminal B. The inverting amplifier 20a can be e.g. a MOSFET.

The current source 30 has a first terminal 30a connected to the first potential (e.g., ground) and a second terminal 30b on the opposite side of the first terminal 30a.

The comparator 40 includes a first MOSFET (M1) including a first conductivity type channel, a second MOSFET (M2) including a first conductivity type channel, and a third MOSFET (M3) including a first conductivity type channel.

The first MOSFET (M1) includes a gate inputted with the output voltage V1 from the transimpedance amplifier 20, a source connected to the second terminal 30b of the current source 30, and a drain connected to a first current terminal N1.

The second MOSFET (M2) includes a gate inputted with the output voltage from the transimpedance amplifier 20 delayed by the delay circuit 42, a source connected to the second terminal 30b of the current source 30, and a drain connected to a second current terminal N2.

The third MOSFET (M3) includes a source connected to the second terminal 30b of the current source 30, a drain connected to the drain of the second MOSFET (M2), and a gate connected to the input terminal A of the transimpedance amplifier 20 via a resistor R2. Thus, the gate of the third MOSFET is supplied with a reference voltage. The circuit including the resistor R2 and connecting the input terminal A of the transimpedance amplifier 20 with the gate of the third MOSFET constitutes a reference voltage supply section.

The first to third MOSFETs can be of e.g. an n-channel enhancement type. The sources of the first to third MOSFETs are set to a common source potential at the terminal C.

The delay circuit 42 includes a resistor R1 provided between the output terminal B of the transimpedance amplifier 20 and the gate of the second MOSFET (M2), and a capacitor C1 provided between the gate of the second MOSFET (M2) and the first potential (e.g., ground). The delay circuit 42 delays the gate voltage applied to the second MOSFET (M2) relative to the gate voltage of the first MOSFET (M1).

The drain of the second MOSFET (M2) and the drain of the third MOSFET (M3) are connected to constitute the second current terminal N2 and output a signal. The signal is switched to high (H) level or low (L) level depending on the presence or absence of an optical signal.

Figure 2A:
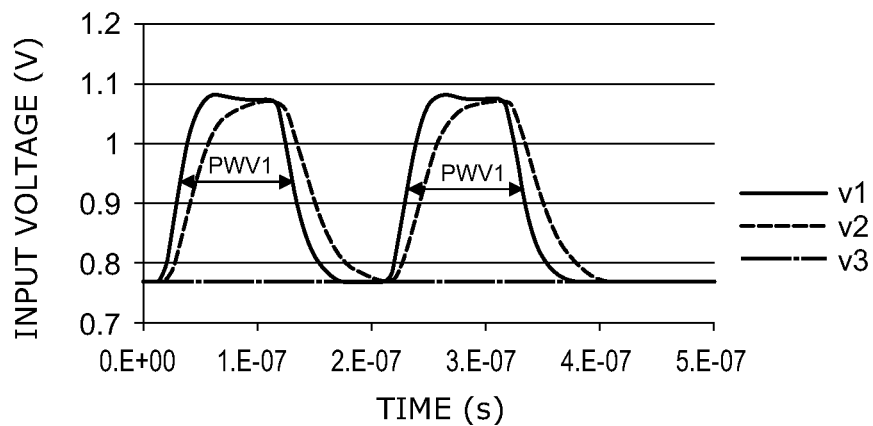
FIG. 2A is a waveform diagram of an input voltage to the comparator and FIG. 2B is a waveform diagram of an output current from the comparator.
Figure 2B:
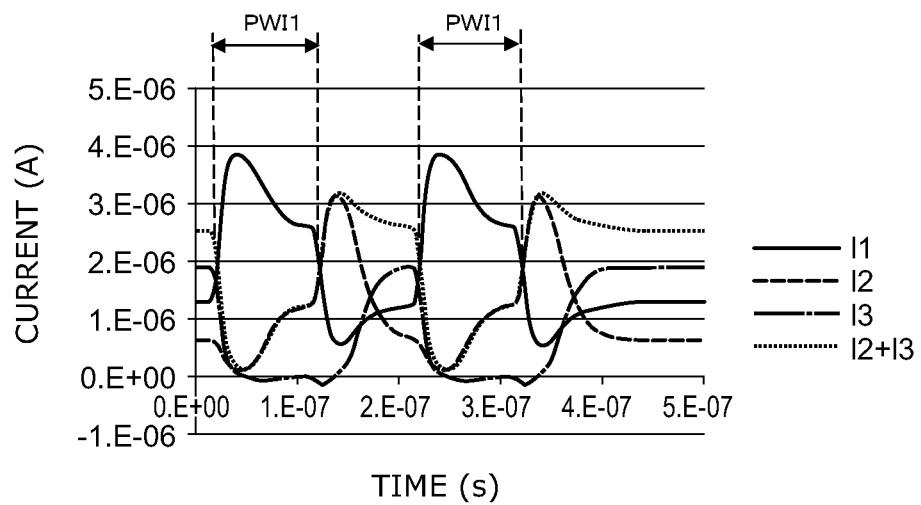

FIG. 2A is a waveform diagram of an input voltage to the comparator. FIG. 2B is a waveform diagram of an output current from the comparator.

With reference to these figures, the operation of the light receiving circuit is described. These figures show an input voltage waveform and an output current waveform of the MOSFET in the case where two optical signal pulses (e.g., with a duty cycle of 50%) with input voltage V1 (pulse width PWV1) are incident on the light receiving element 10. It is assumed that the first to third MOSFETs all have an equal gate length L. Furthermore, it is assumed that formula (1) and formula (2) hold among the gate width W1 of the first MOSFET (M1), the gate width W2 of the second MOSFET (M2), and the gate width W3 of the third MOSFET (M3).

$$W1 > W2 \tag{1}$$

$$W2 + W3 > W1 \tag{2}$$

In the case of different gate lengths, the ratio of width to length of the first gate is set larger than the ratio of width to length of the second gate, and smaller than the sum of the ratio of the width to the length of the second gate and the ratio of width to length of the third gate. That is, the gate lengths and the gate widths are set so as to satisfy $W1/L1 > W2/L2$ and $W2/L2 + W3/L3 > W1/L1$.

By the setting of formula (2), the drain current under no-signal conditions has the relation of formula (3).

$$I2 + I3 > I1 \tag{3}$$

When the optical signal is incident on the light receiving element 10 and the current Ip starts to flow, as shown in FIG. 2A, the input voltage V2 of the gate of the second MOSFET (M2) is lower than the input voltage V1 of the gate of the first MOSFET (M1). Thus, most of the tail current flowing in the current source 30 flows as the drain current I1 of the first MOSFET (M1). Accordingly, the relation to the currents I2, I3 satisfies formula (4).

$$I2 + I3 < I1 \tag{4}$$

When the input voltage V2 catches up with the input voltage V1, the drain current I2 starts to flow also in the second MOSFET (M2). Conversely, the drain current I1 decreases and causes a sag. Immediately after the optical signal vanishes and the current Ip becomes zero, the gate voltage V1 decreases earlier than the gate voltage V2 of the second MOSFET (M2) held by the capacitor C1 of the delay circuit 42. Thus, the drain current I1 decreases, and the drain current I2 increases. After a further lapse of time, the gate voltage of the second MOSFET (M2) turns to a decrease, and the drain current I2 also starts to decrease. However, the drain current I3 starts to increase. Thus, the pulse width PWI1 determined by the cross-point of the sum of the drain current I2 and the drain current I3 with the drain current I1 can be made close to the pulse width PWV1 of the input voltage. Accordingly, the pulse width distortion can be reduced. Thus, by the drain current I3 of the third MOSFET (M3), the time interval between the cross-points of the drain current I1 with the sum of the drain current I2 and the drain current I3 can be easily made close to the pulse width of the input voltage.

Figure 3A:
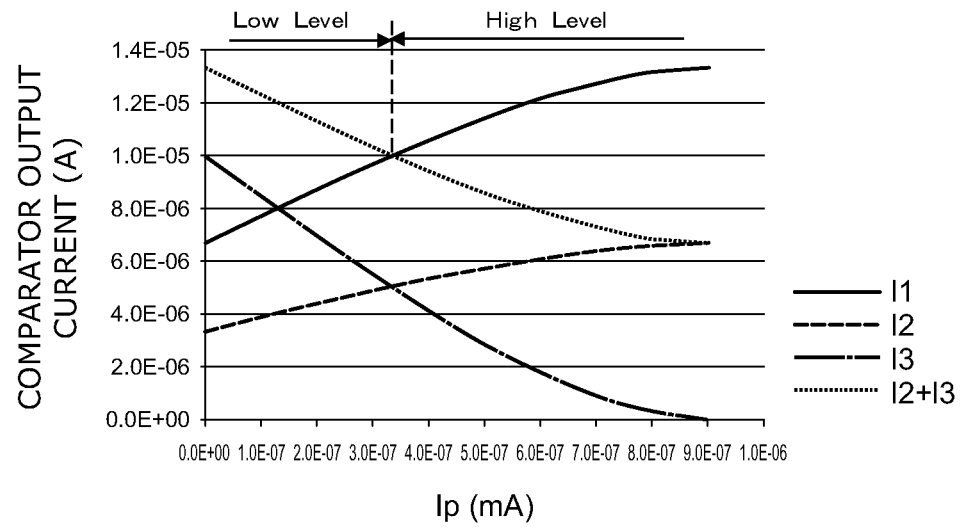
FIG. 3A is a graph showing the dependence of the comparator output current on the current Ip of the light receiving element and FIG. 3B is a graph showing the pulse width distortion with respect to the optical signal input.
Figure 3B:
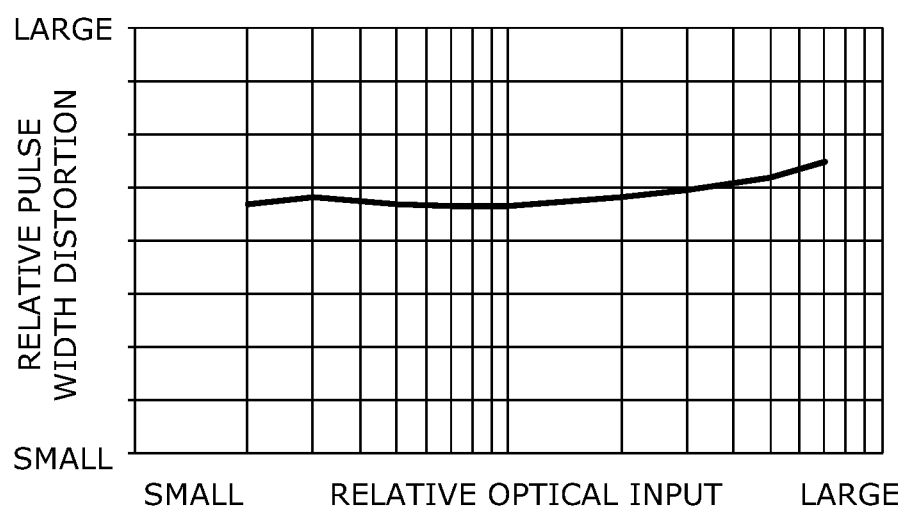

FIG. 3A is a graph showing the dependence of the comparator output current on the current Ip of the light receiving element. FIG. 3B is a graph showing the pulse width distortion with respect to the optical signal input.

At the cross-point of the sum of the drain currents I2+I3 with the drain current I1, the output voltage of the comparator switches from high level to low level.

Furthermore, as shown in FIG. 3B, the pulse width distortion can be held below a prescribed value in a wide variation range of the optical signal input without increasing in response to the increase of the optical signal.

Figure 4:
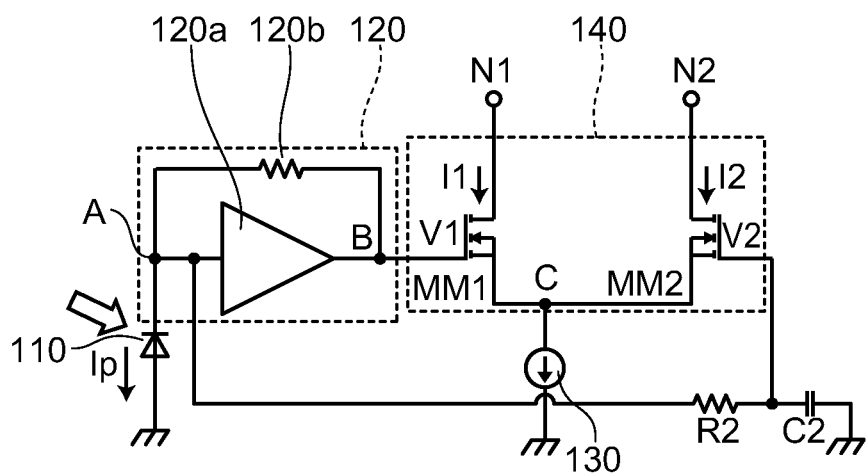
FIG. 4 is a circuit diagram of a light receiving circuit according to a comparative example.

FIG. 4 is a circuit diagram of a light receiving circuit according to a comparative example.

The light receiving circuit of the comparative example does not include elements corresponding to the second MOSFET (M2) and the delay circuit 42 in FIG. 1. The second MOSFET (MM2) corresponds to the third MOSFET (M3) in FIG. 1. The gate of the second MOSFET (MM2) is connected to the input terminal A of a transimpedance amplifier 120 via a resistor R2, and supplied with a reference voltage. Furthermore, the gate length of the second MOSFET (MM2) is made equal to the gate length of the first MOSFET (MM1). On the other hand, the gate width W2 of the second MOSFET (MM2) is set more than or equal to the gate width W1 of the first MOSFET (MM1).

Figure 5A:
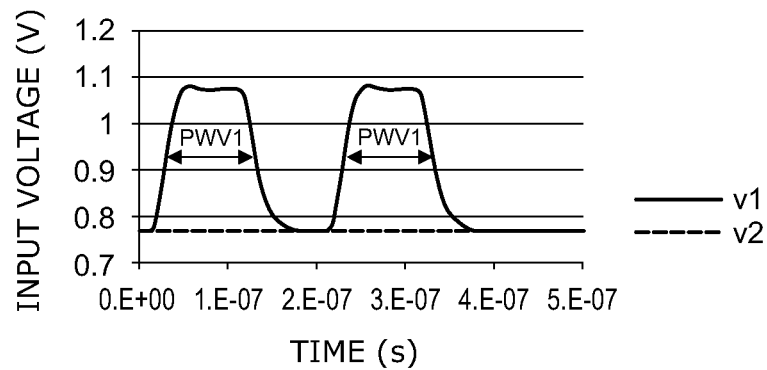
FIG. 5A is a waveform diagram of an input voltage to the comparator in the case where two optical signal pulses with a duty cycle of 50% are incident on the light receiving circuit of the comparative example and FIG. 5B is an output current waveform diagram of the comparator.
Figure 5B:
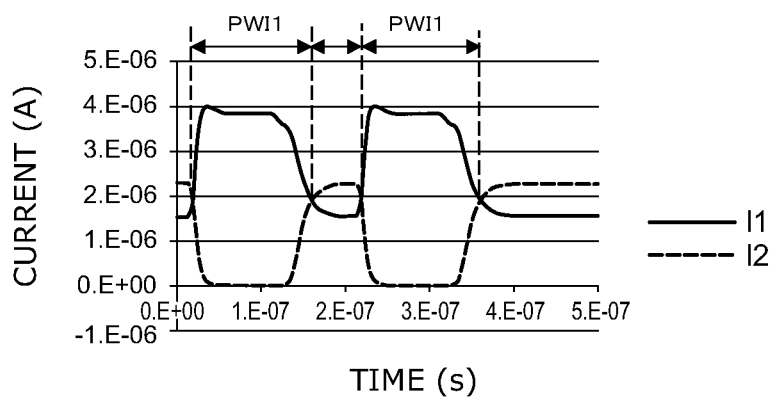

FIG. 5A is a waveform diagram of an input voltage to the comparator in the case where two optical signal pulses with a duty cycle of 50% are incident on the light receiving circuit of the comparative example. FIG. 5B is an output current waveform diagram of the comparator.

Under no-signal conditions, the output currents satisfy I2>I1. When the current Ip flows, the input voltage V1 of the gate of the first MOSFET (MM1) increases, and the drain currents satisfy I2<I1. On the other hand, when the current Ip becomes zero, the drain currents again satisfy I2>I1. At the cross-point of the drain current I2 and the drain current I1, the output voltage switches from high level to low level. In this case, with the increase of optical intensity, the drain current of the first MOSFET (MM1) sharply increases. Thus, as shown in FIG. 5B, the pulse width PWI1 is made much wider than the input pulse width PWV1.

In contrast, in the first embodiment, when the optical signal becomes zero, the input voltage V2 of the second MOSFET (M2) is held for a short time in the delay circuit 42. Thus, the time for turning off the first MOSFET (M1) can be made shorter (than in the case of a fixed threshold). Accordingly, the pulse width distortion can be reduced. Furthermore, there is no need to provide an automatic threshold adjustment circuit requiring high power consumption.

Figure 6:
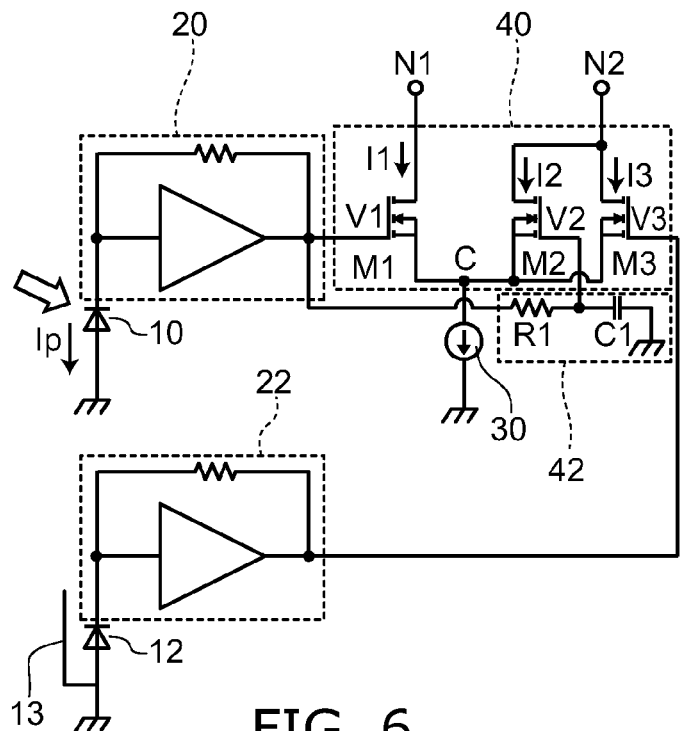
FIG. 6 is a circuit diagram of a light receiving circuit according to a second embodiment.

FIG. 6 is a circuit diagram of a light receiving circuit according to a second embodiment.

The light receiving circuit further includes a dummy light receiving element 12, and a dummy transimpedance amplifier 22 connected thereto. The dummy light receiving element 12 light-shielded with a light shielding plate 13 is connected to the dummy transimpedance amplifier 22. The output voltage of the dummy transimpedance amplifier 22 is supplied to the gate of the third MOSFET (M3) as a reference voltage. That is, the dummy transimpedance amplifier 22 constitutes a reference voltage supply section. This can also realize a light receiving circuit with reduced pulse width distortion.

Figure 7:
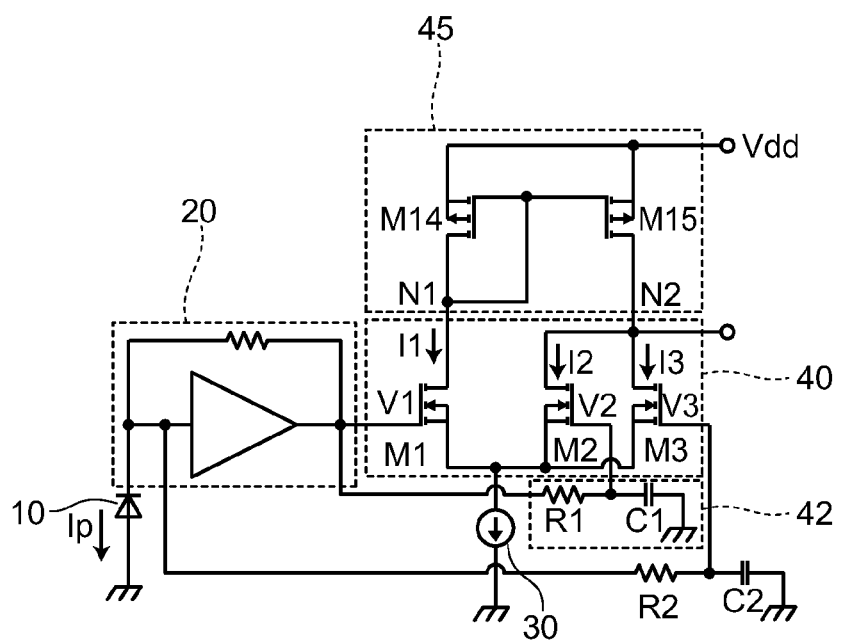
FIG. 7 is a circuit diagram of a light receiving circuit according to a third embodiment.

FIG. 7 is a circuit diagram of a light receiving circuit according to a third embodiment.

The third embodiment further includes a current mirror circuit 45 in addition to the light receiving circuit of the first embodiment. More specifically, the current mirror circuit 45 includes a fourth MOSFET (M14) including a second conductivity type channel, and a fifth MOSFET (M15) including a second conductivity type channel. The first current terminal N1 being the drain of the first MOSFET (M1) is connected with the drain of the fourth MOSFET (M14). The second current terminal N2 being the drain of the second MOSFET (M2) is connected with the drain of the fifth MOSFET (M15). The source of the fourth MOSFET (M14) and the source of the fifth MOSFET (M15) are connected with the power supply voltage Vdd.

It is assumed that the first to third MOSFETs all have an equal gate length. It is assumed that formula (1) and formula (2) hold. Furthermore, it is assumed that the gate length L4 of the fourth MOSFET (M14) is equal to the gate length L5 of the fifth MOSFET. Moreover, the gate width W4 of the fourth MOSFET (M14) is equal to the gate width W5 of the fifth MOSFET (M15). Thus, the voltage signal can be outputted to the second current terminal N2, and the pulse width distortion can be reduced.

Figure 8:
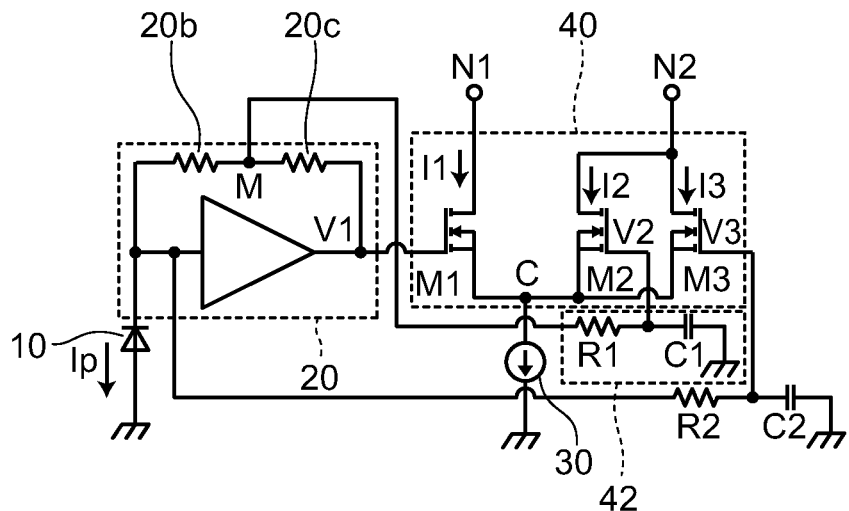
FIG. 8 is a circuit diagram of a light receiving circuit according to a fourth embodiment.

FIG. 8 is a circuit diagram of a light receiving circuit according to a fourth embodiment.

In the fourth embodiment, one end of the delay circuit 42 can be placed at the connecting point M of two series connected resistors 20b, 20c. In this case, the gate lengths of the first to third MOSFETs (M1, M2, M3) can be made equal. Furthermore, with regard to the gate width, it can be assumed that formula (1) and formula (2) hold. Moreover, the resistance values of the two resistors 20b, 20c can be made equal, for instance. This can also realize a light receiving circuit with reduced pulse width distortion.

Figure 9:
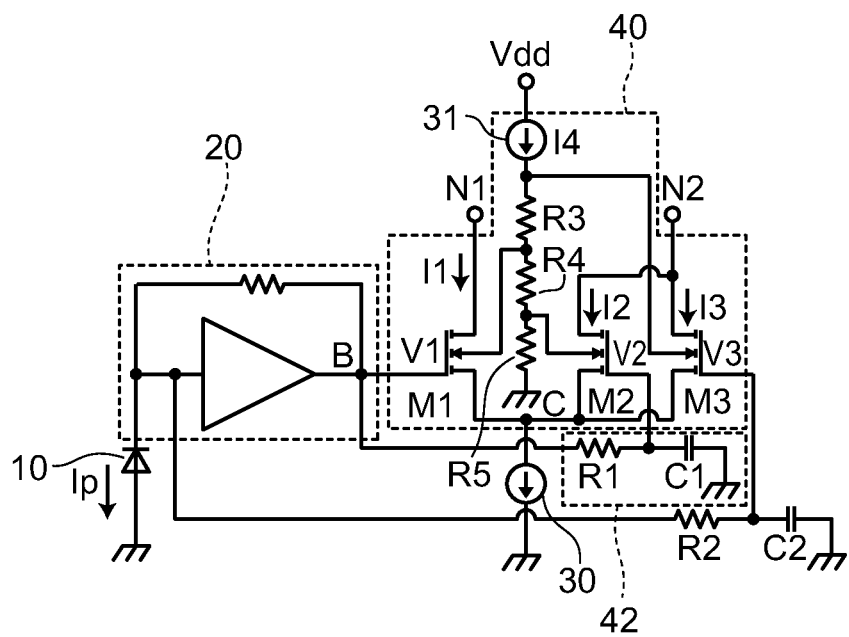
FIG. 9 is a circuit diagram of a light receiving circuit according to a fifth embodiment.

FIG. 9 is a circuit diagram of a light receiving circuit according to a fifth embodiment.

By changing the potential of the back gate of the first to third MOSFETs of the first embodiment, the thresholds of the first to third MOSFETs are changed. To this end, a potential setting circuit including a current source 31 and resistors R3, R4, R5 is provided. The thresholds are set to satisfy Vth(M3)<Vth(M1)<Vth(M2). This can achieve the same effect as changing the gate width. Thus, for the first to third MOSFETs (M1, M2, M3), the gate lengths can be made equal, and the gate widths can be made equal.

Figure 10:
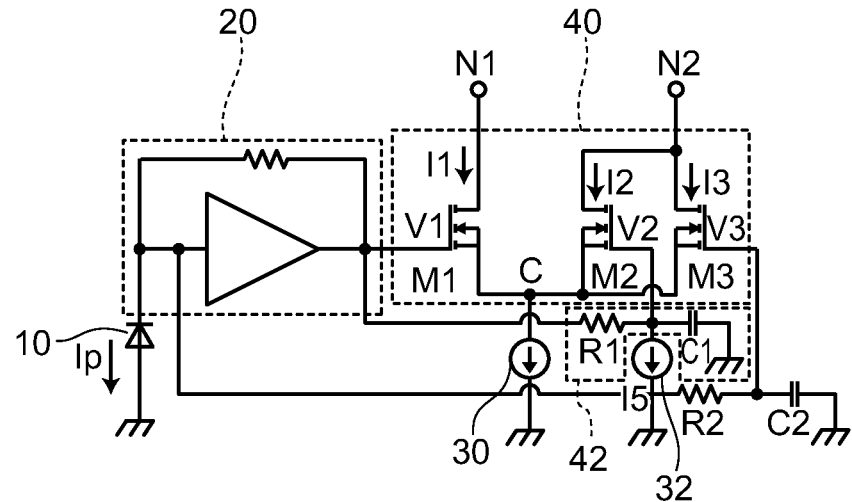
FIG. 10 is a circuit diagram of a light receiving circuit according to a sixth embodiment.

FIG. 10 is a circuit diagram of a light receiving circuit according to a sixth embodiment.

A current source 32 is further connected at the connecting point among the resistor R1 and the capacitor C1 of the delay circuit 42 and the gate of the second MOSFET (M2). This can reduce the gate voltage (V2=V1−I5×R1) of the second MOSFET (M2) and delay the operation of the drain current of the second MOSFET (M2). Here, instead of connecting the back gate to the source, the back gate may be placed at a different potential. With regard to the gate width for an equal gate length, it is assumed that formula (1) and formula (2) hold.

Figure 11:
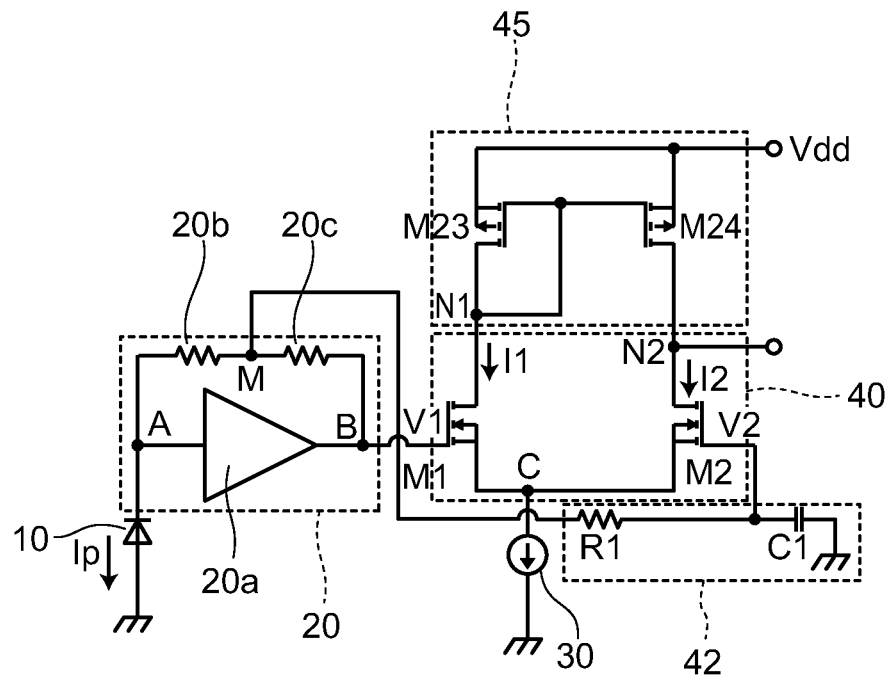
FIG. 11 is a circuit diagram of a light receiving circuit according to a seventh embodiment.

FIG. 11 is a circuit diagram of a light receiving circuit according to a seventh embodiment.

The light receiving circuit includes a light receiving element 10, a transimpedance amplifier 20, a current source 30, a comparator 40, a delay circuit 42, and a current mirror circuit 45.

The transimpedance amplifier 20 includes an input terminal A, an output terminal B, an inverting amplifier 20a, and a feedback resistor including two series connected resistors 20b, 20c. The transimpedance amplifier 20 converts the current signal inputted at the input terminal A from the second terminal of the light receiving element 10 into a voltage signal, and outputs the voltage signal.

The comparator 40 includes a first MOSFET (M1) including a gate inputted with the output voltage of the transimpedance amplifier 20, and a second MOSFET (M2) including a gate inputted with the delayed output voltage. Furthermore, the source of the first MOSFET (M1) and the source of the second MOSFET (M2) are connected to the comparator 40 and have a common source potential. This switches the voltage of the drain of the second MOSFET (M2) to high level or low level.

The current mirror circuit 45 includes a third MOSFET (M23) including a second conductivity type channel, and a fourth MOSFET (M24) including a second conductivity type channel. The first current terminal N1 being the drain of the first MOSFET (M1) is connected with the drain of the third MOSFET (M23). The second current terminal N2 being the drain of the second MOSFET (M2) is connected with the drain of the fourth MOSFET (M24). The source of the third MOSFET (M23) and the source of the fourth MOSFET (M24) are connected with the power supply voltage Vdd.

The delay circuit 42 includes a resistor R1 provided between the gate of the second MOSFET and the connecting point M of the two resistors 20b, 20c, and a capacitor C1 provided between the gate of the second MOSFET and the first potential (e.g., ground). Here, the resistance values of the two resistors 20b, 20c can be made equal, for instance.

Figure 12A:
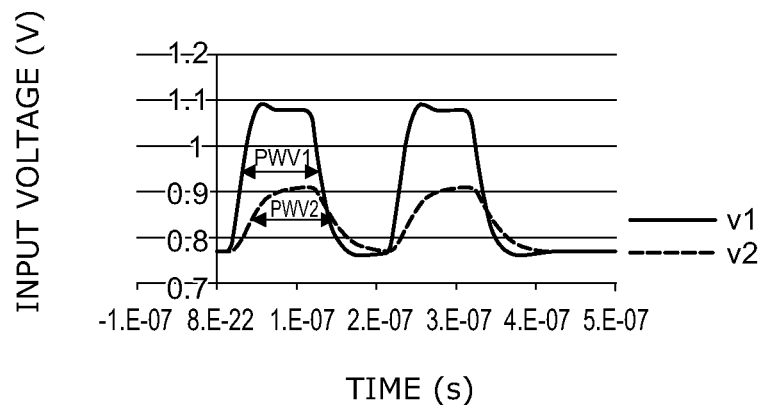
FIG. 12A is an input voltage waveform diagram of the seventh embodiment and FIG. 12B is an output current waveform diagram.
Figure 12B:
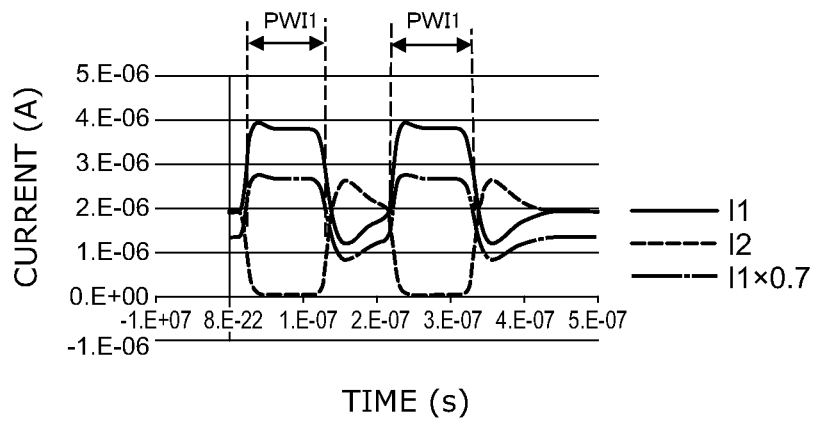

FIG. 12A is an input voltage waveform diagram of the seventh embodiment. FIG. 12B is an output current waveform diagram.

In FIGS. 12A and 12B, the first to fourth MOSFETs (M1, M2, M3, M4) have an equal gate length. The gate widths W1, W2 of the first and second MOSFETs (M1, M2) satisfy W1=W2. The gate widths W4, W5 of the third and fourth MOSFETs (M23, M24) satisfy W5=W4×0.7. Two optical signal pulses with a duty cycle of 50% are incident on the light receiving element 10. When the optical signal vanishes, the drain current I1 undershoots the original no-signal level. The drain current I2 of the second MOSFET (M2), where the gate voltage is temporarily held by the delay circuit, overshoots the original no-signal level. Thus, the cross-point of the drain current I2 and the drain current I1×0.7 is improved in pulse width distortion compared with the case of no delay circuit. Here, the gate width can be set to a suitable value in the range of W5<W4.

Figure 13:
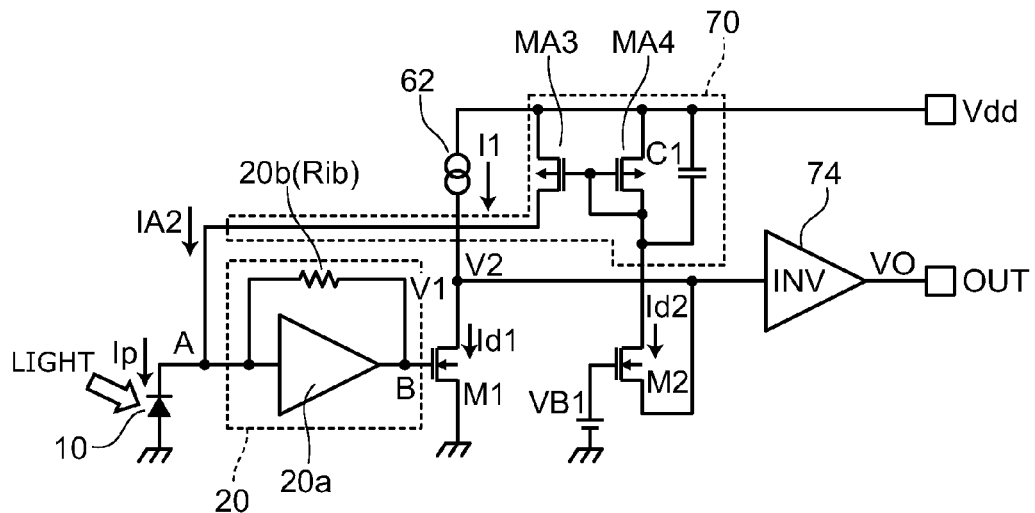
FIG. 13 is a circuit diagram of a light receiving circuit according to an eighth embodiment.

FIG. 13 is a circuit diagram of a light receiving circuit according to an eighth embodiment.

The light receiving circuit includes a light receiving element 10, a transimpedance amplifier 20, a first MOSFET (M1), a second MOSFET (M2), a current source 62, and a current path 70.

The light receiving element 10 has a first terminal connected to a first potential (e.g., ground), and a second terminal. The light receiving element 10 converts the received optical signal into a current signal, and outputs the current signal.

The transimpedance amplifier 20 includes an input terminal A, an output terminal B, an inverting amplifier 20a including a MOSFET and the like, and a feedback resistor 20b. The transimpedance amplifier 20 converts the current inputted at the input terminal A from the light receiving element 10 into a voltage, and outputs the voltage.

The gate of the first MOSFET (M1) is inputted with the output voltage V1 of the transimpedance amplifier 20.

The current source 62 biases the output of the first MOSFET (M1) and determines the switching current of the output voltage V2. The second MOSFET (M2) detects switching of the output current Id1 of the first MOSFET (M1) and outputs a current Id2. Here, the MOSFET constituting the inverting amplifier 20a, the first MOSFET (M1), and the second MOSFET (M2) can be of e.g. an n-channel enhancement type.

The current path 70 includes a current mirror circuit made of a third MOSFET (MA3) and a fourth MOSFET (MA4), and a capacitance C1 as a delay means. In the case where a sufficient delay time is obtained by the current mirror circuit and the like, the capacitance C1 may be omitted. Thus, in response to the current Id2 outputted from the second MOSFET (M2), the current IA2 is fed back to the input terminal A of the transimpedance amplifier 20. The third and fourth MOSFETs (MA3, MA4) can be of a p-channel enhancement type. The signal is outputted via an output circuit 74 such as an inverter having a suitable threshold. Alternatively, the output circuit 74 may be a buffer circuit based on a comparator having a suitable threshold.

Figure 14:
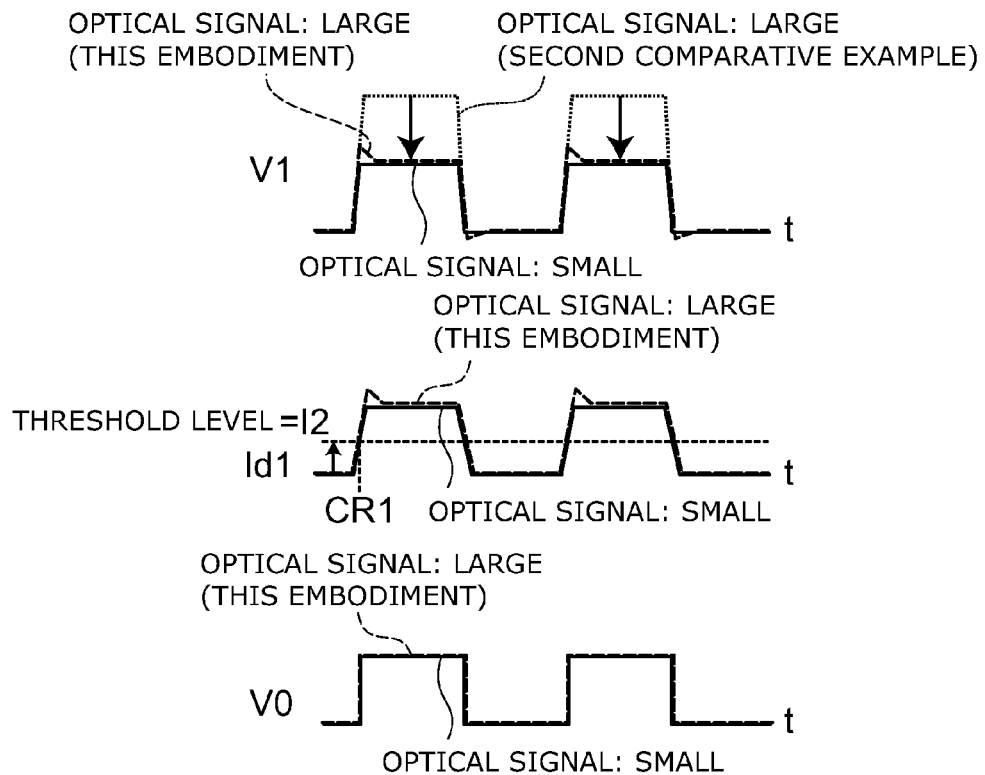
FIG. 14 is an operating waveform diagram of the light receiving circuit of the eighth embodiment.

FIG. 14 is an operating waveform diagram of the light receiving circuit of the eighth embodiment.

The solid line represents the state of the absence of an optical signal, and the dashed line represents the state of the presence of an optical signal. The gate voltage VB1 of the second MOSFET (M2) is set so that when the output voltage V2 is decreased to switch the output circuit 74, the fourth MOSFET (MA4) is turned on, and the current Id1 exceeds the current I2 of the second current source 62. The current IA2 mirrored by the current mirror circuit is fed back to the input terminal A of the transimpedance amplifier 20.

In the state of the presence of an optical signal, the current IA2 cancels the current Ip and reduces the current flowing in the feedback resistor 20b. Thus, as represented by the dashed line (this embodiment), the voltage V1 decreases and suppresses the drain current Id1. Accordingly, when the output is switched, the increase of the drain current Id1 represented by the dashed line stops, and the power consumption does not increase. The current IA2 shifts the input current level downward. Thus, the rise time increases, and the fall time decreases. This can reduce the pulse width distortion as in the output voltage Vo represented by the dashed line.

Figure 15:
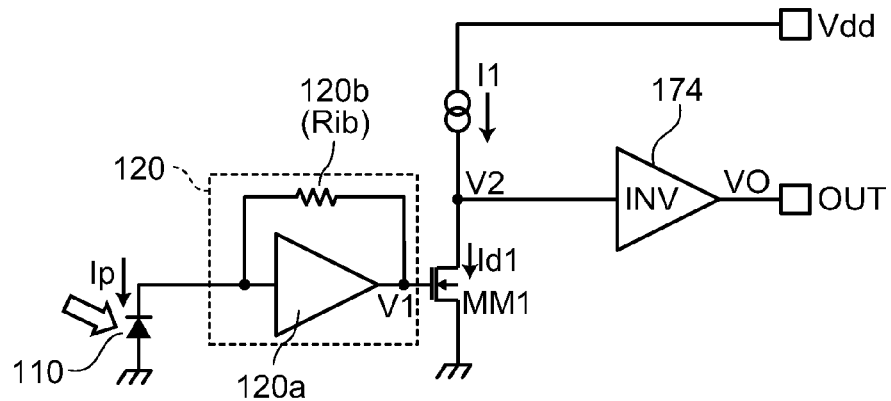
FIG. 15 is a circuit diagram of a light receiving circuit according to a second comparative example.

FIG. 15 is a circuit diagram of a light receiving circuit according to a second comparative example.

Figure 16:
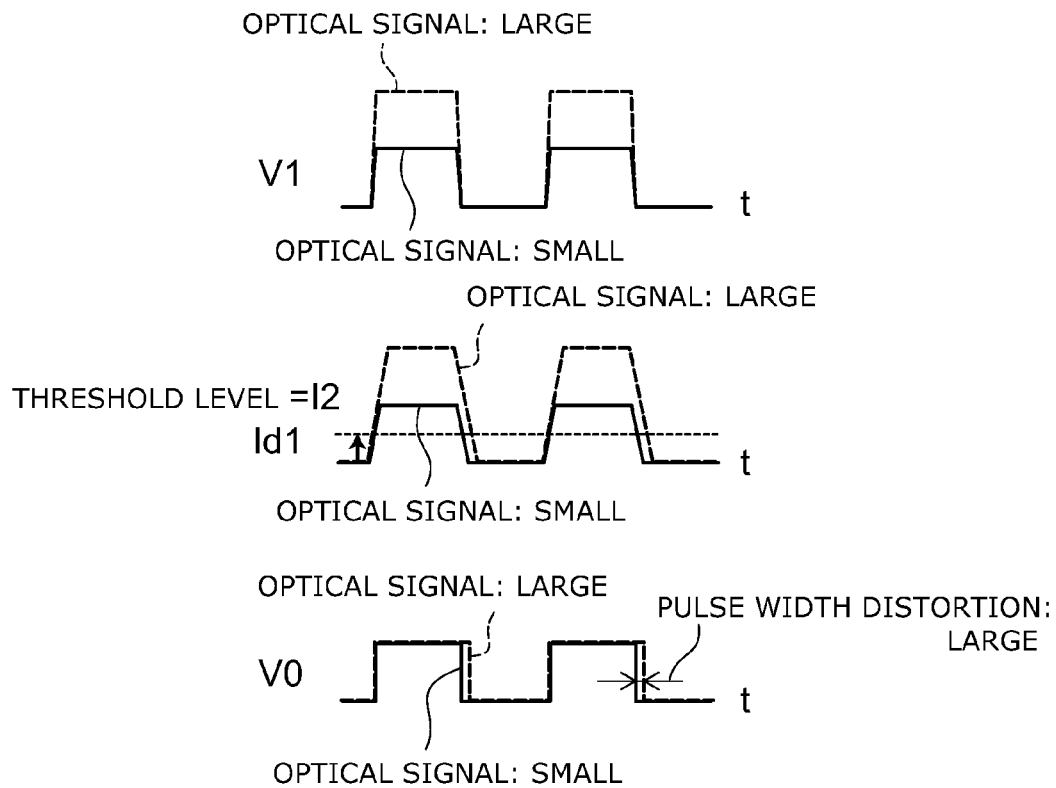
FIG. 16 is an operating waveform diagram of the second comparative example.

FIG. 16 is an operating waveform diagram of the second comparative example.

The transimpedance amplifier 20 is subjected to feedback by the feedback resistor (resistance value Rib) 20b. When there is no optical signal and no current Ip flows, the gate voltage of the MOSFET (MM1) is low. The drain current Id1 of the MOSFET (MM1) is set to be smaller than the current Id2, and the voltage V2 assumes high level. Thus, the voltage V2 is inverted by the output circuit 174 made of an inverter. Accordingly, the output terminal voltage VO assumes low level.

In the state inputted with an optical signal (represented by the dashed line), the drain voltage V1 of the MOSFET constituting the transimpedance amplifier 120 increases by the amount of Rib×Ip relative to the threshold. In proportion to the current Ip, the gate voltage of the first MOSFET (MM1) increases, and the drain current Id1 of the first MOSFET (MM1) also increases. When the drain current Id1 becomes larger than the current I1, the drain voltage V2 is switched to low level, and the output terminal voltage VO becomes high level. When the optical signal vanishes, the voltage V2 again becomes high level, and the output terminal voltage VO returns to low level. As the optical signal becomes larger, the voltage V1 decreases, and it takes longer time until the current Id1 becomes smaller than the drain current I2. As represented by the output terminal voltage VO (dashed line) of FIG. 16, this increases the pulse width distortion, which is the difference between the rise time and the fall time.

Figure 17A:
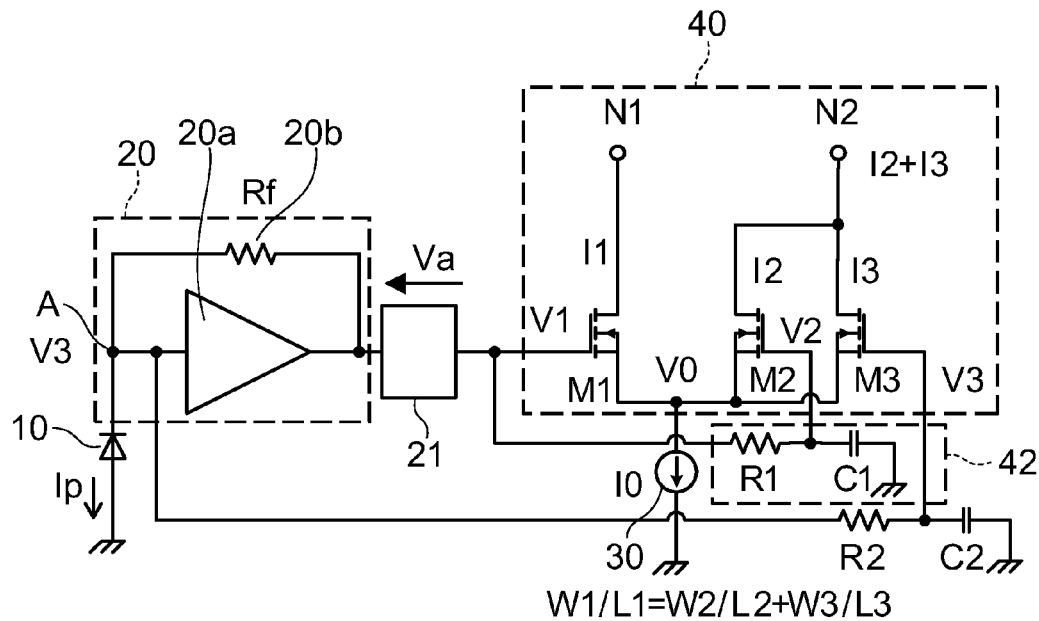
FIG. 17A is a circuit diagram of a light receiving circuit according to a ninth embodiment.
Figure 17B:
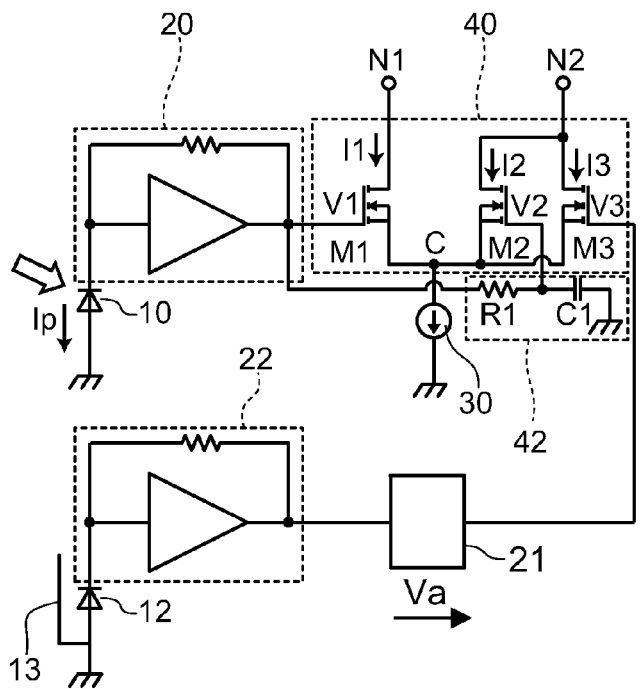
FIG. 17B is a circuit diagram of a variation of the ninth embodiment.

FIG. 17A is a circuit diagram of a light receiving circuit according to a ninth embodiment. FIG. 17B is a circuit diagram of a variation of the ninth embodiment.

The light receiving circuit of this embodiment shown in FIG. 17A further includes a level shift circuit 21 in addition to the light receiving circuit of the first embodiment of FIG. 1. More specifically, the level shift circuit 21 level-shifts the output voltage signal of the transimpedance amplifier 20 by a shift voltage Va to the lower side. The level-shifted output voltage signal is inputted as an input voltage V1 to the first gate of the first MOSFET (M1). Furthermore, the level-shifted output voltage signal passes through the delay circuit 42 composed of the resistor R1 and the capacitor C1, and is inputted as an input voltage V2 to the second gate of the second MOSFET. The input voltage V3 of the transimpedance amplifier 20 is inputted as a reference voltage V3 to the gate of the third MOSFET via the resistor R1.

Alternatively, the level shift circuit may level-shift the gate voltage of the third MOSFET (M3) by a shift voltage Va to the higher side. The light receiving circuit of the variation shown in FIG. 17B further includes a level shift circuit for level-shifting the third gate voltage of the third MOSFET (M3) by a shift voltage Va to the higher side in addition to the light receiving circuit of the second embodiment shown in FIG. 6.

For the first to third MOSFETs, the gate widths are denoted as W1-W3, and the gate lengths are denoted as L1-L3, respectively. The mobility is denoted as $\mu 0$. The gate oxide film capacitance per unit area is denoted as Cox. The current of the light receiving element 10 is denoted as i. The feedback resistance is denoted as Rf. Then, the basic relation in the saturation region of the MOSFET can be expressed by formulas (5)-(7).

$$I1 = \frac{\beta 1}{2}(V1 - V0 - Vth)^2 = \frac{\beta 1}{2}(V3 - V0 - Vth - Va + iRf)^2 \quad (5)$$

where $\beta 1 = \left(\frac{W1}{L1}\right)\mu 0 Cox.$ $$I2 = \frac{\beta 2}{2}(V2 - V0 - Vth)^2 = \frac{\beta 2}{2}(V3 - V0 - Vth - V0 + iRf)^2 \quad (6)$$

where $\beta 2 = \left(\frac{W2}{L2}\right)\mu 0 Cox.$ $$I3 = \frac{\beta 3}{2}(V3 - V0 - Vth)^2 \quad (7)$$

where $\beta 3 = \left(\frac{W3}{L3}\right)\mu 0 Cox.$

Furthermore, the threshold of the PD current i satisfying I1=I2+I3 among the drain currents is denoted as ith. Then, formula (8) holds. That is, the threshold ith is a PD current determining the pulse width of the signal and switching the signal.

$$i_{th} = \frac{Va}{Rf} + \frac{-1 + \sqrt{\frac{\beta 3}{\beta 1 - \beta 2}}}{Rf} \times \frac{A}{\beta 1 + \beta 2 + \beta 3} \quad (8)$$

where $$A = -(\beta 1 + \beta 2) \times (i_{th} Rf - Va) + \sqrt{2(\beta 1 + \beta 2 + \beta 3)I0 - \beta 3(\beta 1 + \beta 2) \times (i_{th} Rf - Va)^2}.$$

In this embodiment, the gate lengths Lj and the gate widths Wj are set so that formula (9) substantially holds among the ratios of the gate width Wj to the gate length Lj (j=1, 2, 3) of the MOSFETs.

$$W1/L1 = W2/L2 + W3/L3 \quad (9)$$

When formula (9) holds, β1=β2+β3 follows. Thus, the second term of formula (8) expressing the threshold current ith becomes zero. The threshold ith is determined by Va/Rf, and the term including β1-β3 is eliminated. The mobility μ0 included in β1-β3 decreases with the temperature increase. However, the mobility μ0 is not included in the expression of the threshold ith. Thus, the temperature dependence of the threshold ith is reduced. That is, the threshold ith can be determined by Va/Rf without substantially depending on temperature. Also in the light receiving circuit of the variation shown in FIG. 17B, formula (8) expressing the threshold current ith does not include the mobility μ0. Thus, a constant threshold current ith independent of temperature can be obtained.

Figure 18:
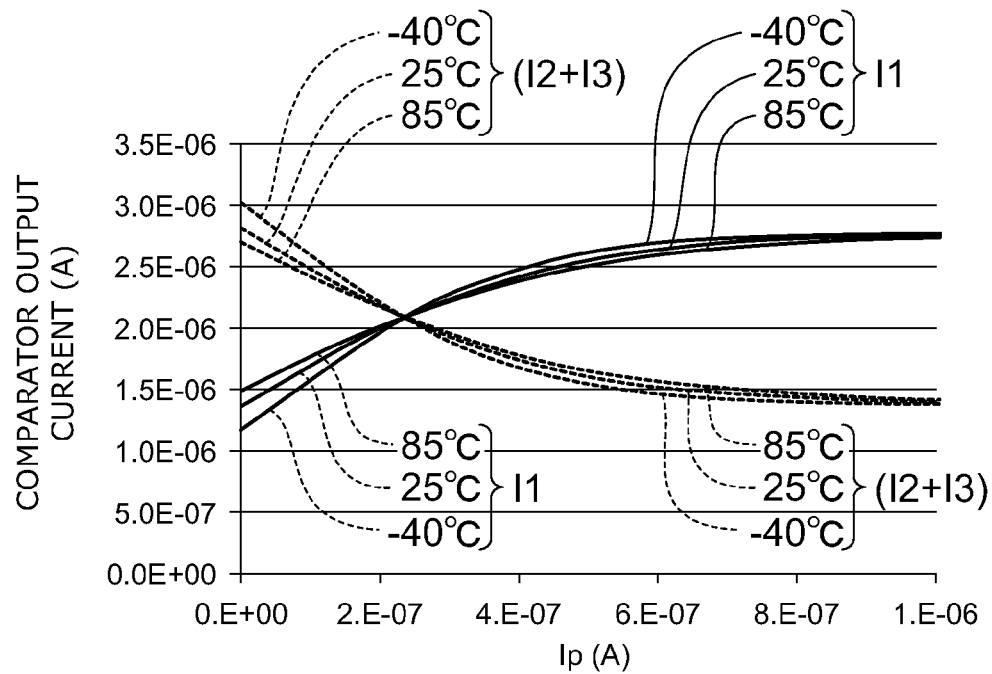
FIG. 18 is a graph showing the dependence of the comparator output current on the current Ip of the light receiving element according to the ninth embodiment.

FIG. 18 is a graph showing the dependence of the comparator output current on the current Ip of the light receiving element according to the ninth embodiment.

The vertical axis represents the output current (A), and the horizontal axis represents the current Ip (A) of the light receiving element 10. The solid line represents the drain current I1 (−40° C., 25° C., 85° C.). The dashed line represents the sum of the drain currents I2+I3 at −40° C., 25° C., and 85° C. This figure shows a result of simulation performed under the settings of Rf=200 kΩ/, I0=4 μA, W1/L1=10 μm/0.6 μm, W2/L2=5 μm/0.6 μm, and W3/L3=5 μm/0.6 μm. At temperatures of −40° C. to +85° C., the current threshold ith (PD current i satisfying I1=I2+I3) is located around 0.24 μA, and its variation is small.

Here, the statement that the formula (9) substantially holds means that W1/L1 is 0.8×(W2/L2+W3/L3) or more and 1.2× (W2/L2+W3/L3) or less.

Figure 19:
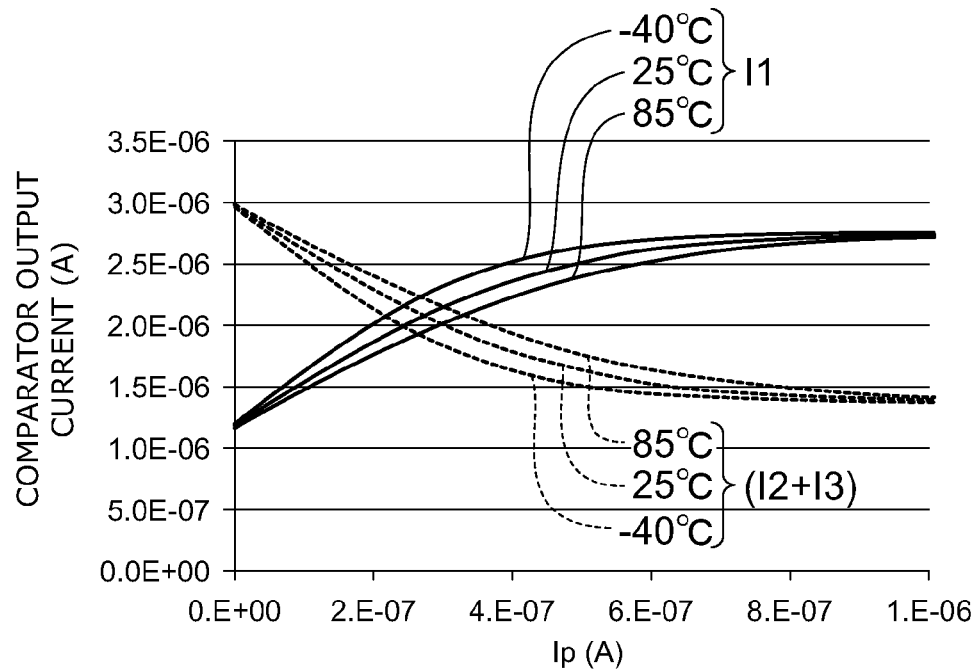
FIG. 19 is a graph showing the dependence of the output current on the current of the light receiving element according to the first embodiment.

FIG. 19 is a graph showing the dependence of the output current on the current of the light receiving element according to the first embodiment.

In the first embodiment, among the ratios of the gate width Wj to the gate length Lj (j=1, 2, 3) of the MOSFETs, the relations of W1/L1>W2/L2 and W2/L2+W3/L3>W1/L1 hold. Here, the parameters are set as Rf=200 kΩ, I0=4 μA, W1/L1=10 μm/0.6 μm, W2/L2=5 μm/0.6 μm, and W3/L3=20 μm/0.6 μm. The threshold ith at −40° C. is generally 0.2 μA. The threshold ith at 25° C. is generally 0.27 μA. The threshold ith at 85° C. is generally 0.33 μA. That is, the temperature-induced variation ratio of the threshold current ith relative to the threshold ith at 25° C. is as large as 74% (−40° C.) to 122% (85° C.).

Figure 20:
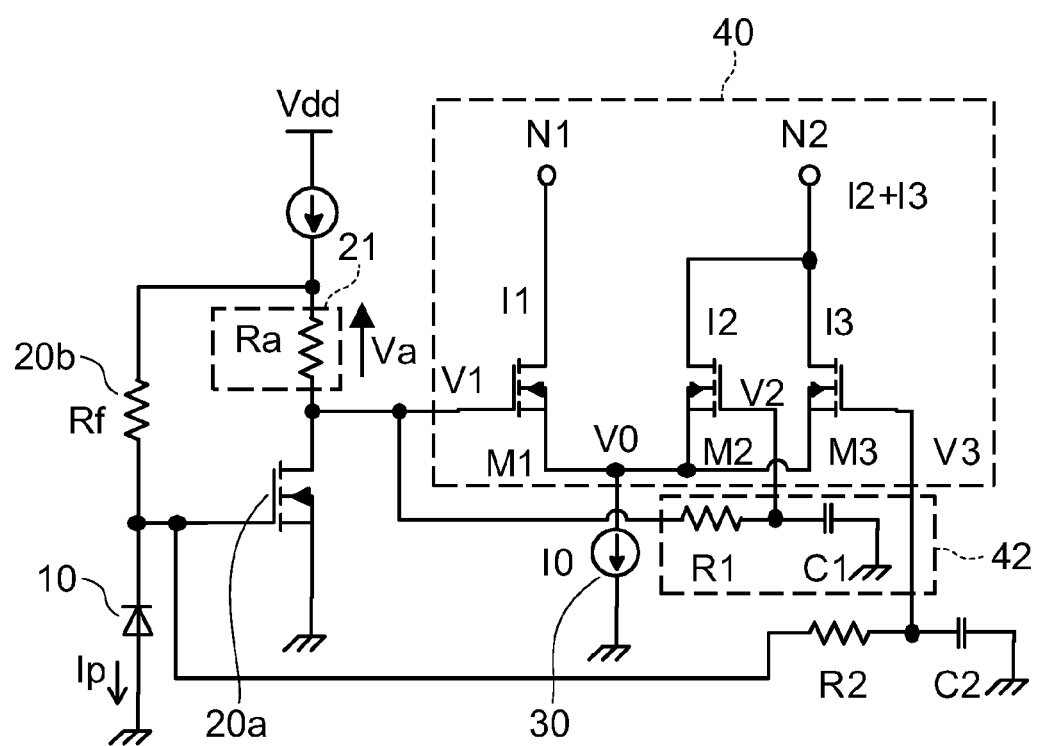
FIG. 20 is a circuit diagram of a light receiving circuit according to a tenth embodiment.

FIG. 20 is a circuit diagram of a light receiving circuit according to a tenth embodiment.

The level shift circuit 21 can be configured as a resistor Ra provided between the drain (connected to the first gate of the first MOSFET) of the MOSFET constituting the inverting amplifier 20a and one terminal of the feedback resistor 20b. That is, the level shift circuit 21 can be incorporated in the transimpedance amplifier 20.

The first to tenth light receiving circuits include at least two MOSFETs provided in a stage subsequent to the transimpedance amplifier 20, and a MOSFET connected to the input terminal of the transimpedance amplifier 20. These MOSFETs are used to control the timing of switching the output voltage to high or low level. Thus, a light receiving circuit capable of reducing the pulse width distortion is provided. Accordingly, a high-speed pulse signal with a repetition frequency of e.g. 1-10 MHz can be transmitted at low error rate.

A photocoupler including such a light receiving circuit and a light transmitting portion for transmitting an optical signal can transfer a signal with reduced pulse width distortion between different power supply systems insulated from each other. The light transmitting portion includes at least a light emitting element. Thus, the photocoupler can be widely used in electronic devices for industrial, communication, and household use.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A light receiving circuit comprising:
a light receiving element configured to convert a received optical signal into a current signal and to output the current signal;
a transimpedance amplifier configured to convert the current signal into a first voltage;
a delay circuit configured to delay the first voltage; and
a comparator including first, second, and third current control elements each including first, second, and third electrodes and configured to control current of the third electrode by voltage of the second electrode with reference to the first electrode, the first electrodes of the first to third current control elements being commonly connected to current supply means, the first voltage being inputted to the second electrode of the first current control element, output voltage of the delay circuit being inputted to the second electrode of the second current control element, a second voltage being inputted to the second electrode of the third current control element, the comparator being configured to compare output current of the first current control element with sum of output current of the second current control element and output current of the third current control element.

2. The circuit according to claim 1, wherein the first to third current control elements are MOSFETs, and ratio of gate width to gate length of the first current control element is larger than ratio of gate width to gate length of the second current control element and smaller than sum of the ratio of the gate width to the gate length of the second current control element and ratio of gate width to gate length of the third current control element.

3. The circuit according to claim 1, further comprising:
a level shift circuit configured to shift the first voltage or the second voltage,
the first to third current control elements being MOSFETs, and ratio of gate width to gate length of the first current control element being substantially equal to sum of ratio of gate width to gate length of the second current control element and ratio of gate width to gate length of the third current control element.

4. The circuit according to claim 1, wherein
the first to third current control elements are MOSFETs, and
back gate voltage of the first current control element is higher than back gate voltage of the second current control element and lower than back gate voltage of the third current control element.

5. The circuit according to claim 2, further comprising:
a dummy light receiving element shielded from the optical signal; and
a dummy transimpedance amplifier having an input terminal connected to a terminal of the dummy light receiving element and outputting the second voltage.

6. The circuit according to claim 3, further comprising:
a dummy light receiving element shielded from the optical signal; and
a dummy transimpedance amplifier having an input terminal connected to a terminal of the dummy light receiving element and outputting the second voltage.

7. The circuit according to claim 3, wherein the level shift circuit is incorporated in the transimpedance amplifier or provided between the transimpedance amplifier and the first current control element.

8. The circuit according to claim 7, wherein the level shift circuit includes a resistor.

9. The circuit according to claim 1, wherein
the transimpedance amplifier includes an inverting amplifier and a feedback resistor,
the feedback resistor includes two series connected resistors,
an input end of the delay circuit is connected between the two resistors, and
an output end of the delay circuit is connected to the second electrode of the second current control element.

10. The circuit according to claim 2, wherein
the transimpedance amplifier includes an inverting amplifier and a feedback resistor,
the feedback resistor includes two series connected resistors,
an input end of the delay circuit is connected between the two resistors, and
an output end of the delay circuit is connected to the second electrode of the second current control element.

11. The circuit according to claim 1, further comprising:
a current mirror circuit including a fourth current control element connected to the third electrode of the first current control element and a fifth current control element connected to the third electrode of the second current control element,
the first current control element and the second current control element having a channel of first conductivity type, and
the fourth current control element and the fifth current control element having a channel of second conductivity type opposite to the first conductivity type.

12. A light receiving circuit comprising:
a light receiving element configured to convert an optical signal into a current signal and to output the current signal;
a transimpedance amplifier including an inverting amplifier and a feedback resistor and configured to convert the current signal into a voltage signal and to output the voltage signal;
a first current control element inputted with the voltage signal of the transimpedance amplifier;
a current source configured to bias output of the first current control element and to determine a switching current of output voltage;
a second current control element configured to detect switching of the output current of the first current control element and to output a current; and
a current path configured to feed back a current to the input terminal of the transimpedance amplifier in response to the current outputted from the second current control element.

13. A photocoupler comprising:
a light transmitting portion configured to transmit the optical signal; and
the light receiving circuit according to claim 1.

14. A photocoupler comprising:
a light transmitting portion configured to transmit the optical signal; and
the light receiving circuit according to claim 2.

15. A photocoupler comprising:
a light transmitting portion configured to transmit the optical signal; and
the light receiving circuit according to claim 3.

16. A photocoupler comprising:
a light transmitting portion configured to transmit the optical signal; and
the light receiving circuit according to claim 12.

* * * * *